(12) United States Patent
Jakobs et al.

(10) Patent No.: US 7,386,696 B2
(45) Date of Patent: Jun. 10, 2008

(54) SEMICONDUCTOR MEMORY MODULE

(75) Inventors: Andreas Jakobs, München (DE);
Hermann Ruckerbauer, Moos (DE);
Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 391 days.

(21) Appl. No.: 10/887,019

(22) Filed: Jul. 8, 2004

(65) Prior Publication Data
US 2005/0044305 A1    Feb. 24, 2005

(30) Foreign Application Priority Data
Jul. 8, 2003    (DE) ............................... 103 30 812

(51) Int. Cl.
*G06F 12/00*    (2006.01)
(52) U.S. Cl. ...................... 711/167; 711/100; 711/168; 713/401
(58) Field of Classification Search ................ 711/100, 711/167, 168, 401
See application file for complete search history.

(56) References Cited

U.S. PATENT DOCUMENTS

2002/0084458 A1*    7/2002    Halbert et al. ................. 257/63
2002/0117745 A1*    8/2002    Borkar et al. ................ 257/691
2002/0161968 A1    10/2002    Yoo et al.

\* cited by examiner

*Primary Examiner*—Sanjiv Shah
*Assistant Examiner*—Jae Un Yu
(74) *Attorney, Agent, or Firm*—Dicke, Billig & Czaja, PLLC

(57) ABSTRACT

The invention relates to a semiconductor memory module having a plurality of memory chips arranged in at least one row and at least one buffer chip which drives and receives clock signals and command and address signals to the memory chips and data signals to and from the memory chips via a clock, address, command and data bus inside the module and which forms an interface to an external primary memory bus. The semiconductor memory module has an even number of buffer chips arranged on it and all of the memory chips are connected to two respective buffer chips at least by one signal line type from a signal group and just to one of the two buffer chips by the remaining signal lines from the group. The sum of the electrical signal propagation times for the actuating signals via their lines from one buffer chip to a respective one of the memory chips and the electrical signal propagation times for the data signals from this memory chip to the other buffer chip during the read operation is the same for all of the memory chips, and control means for controlling the respective data write and read operation to or from the memory chips are provided in order to drive the clock signals and command and address signals in the same respective direction as the data signals via the bus inside the module when data are being written and read.

19 Claims, 9 Drawing Sheets

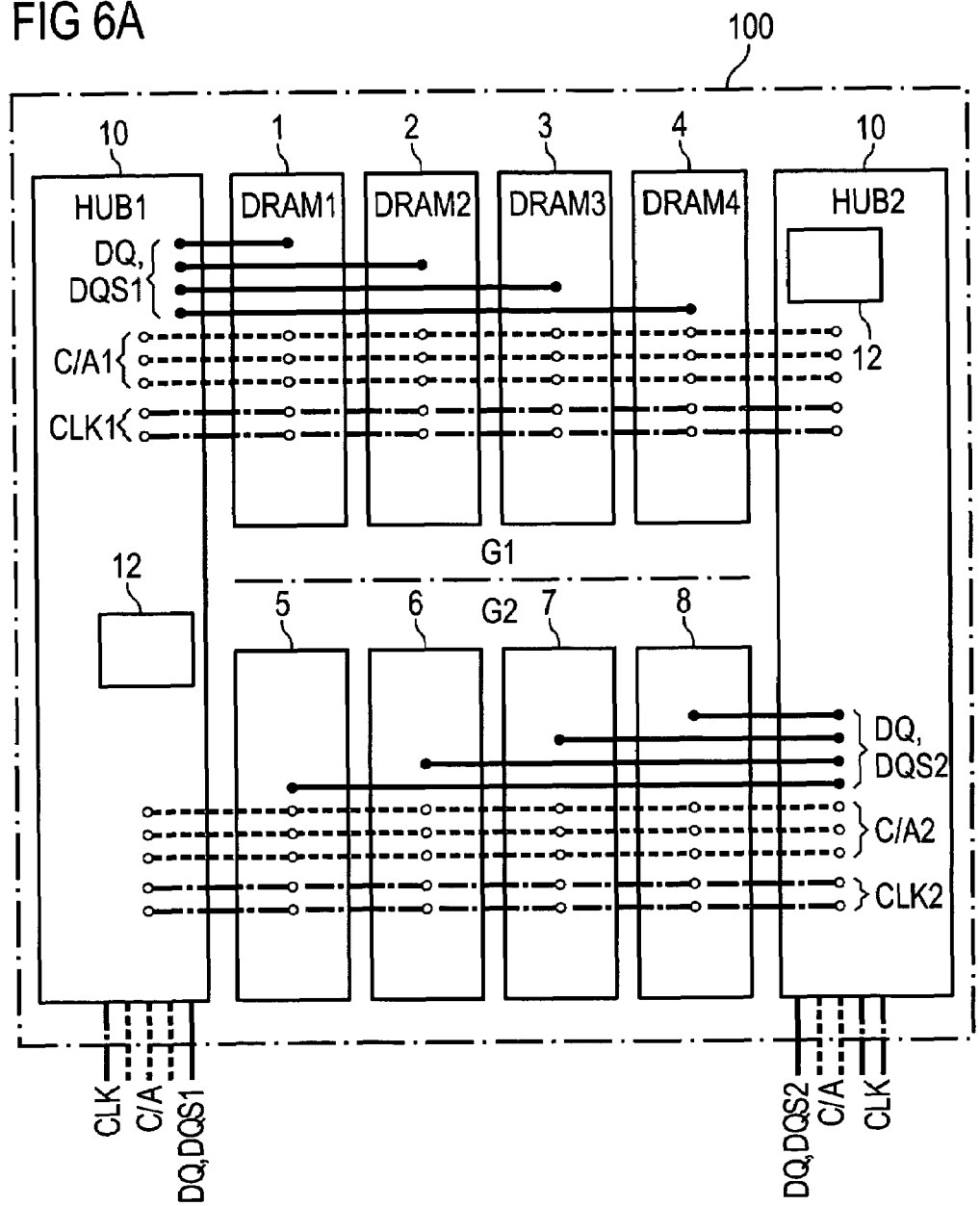

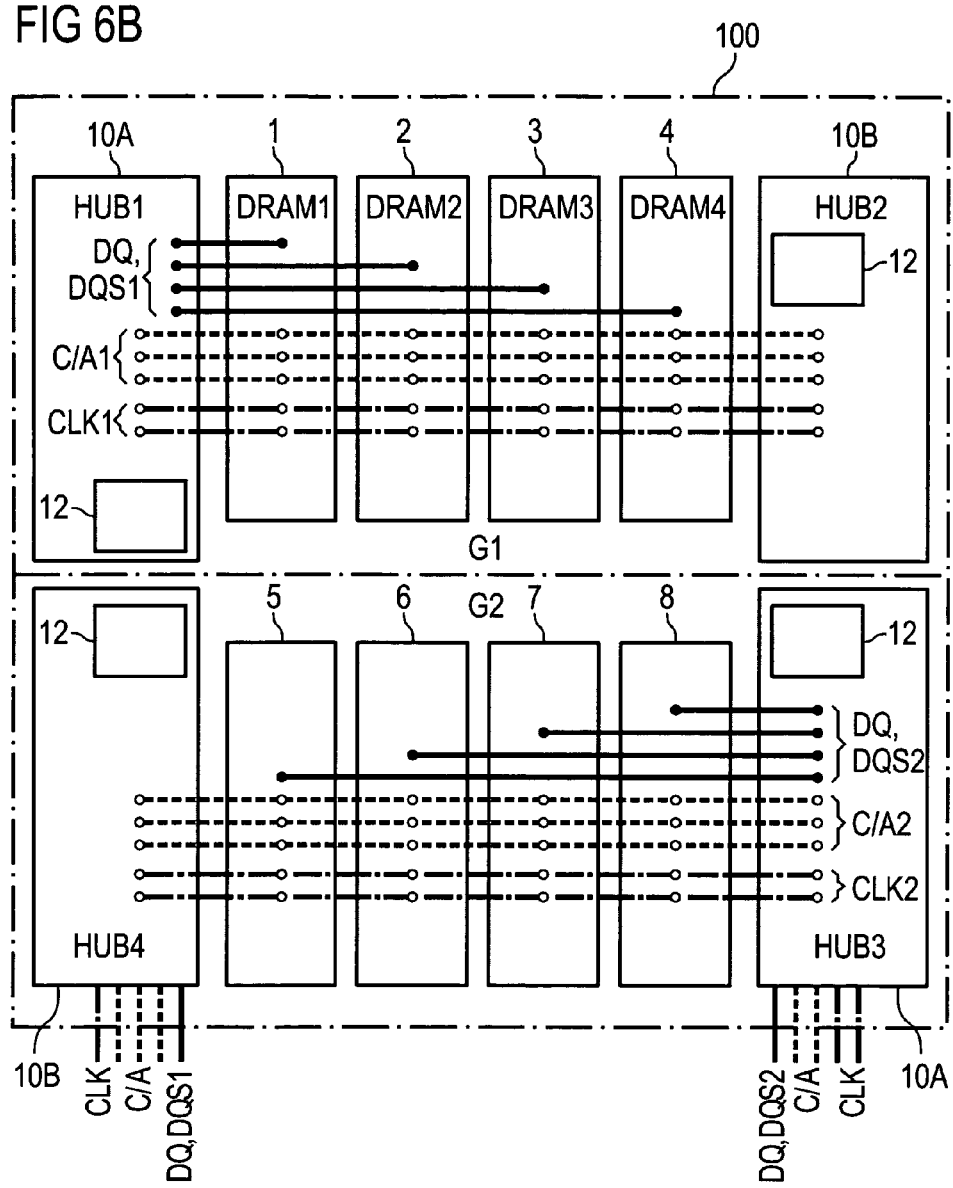

SEMICONDUCTOR MEMORY MODULE

CROSS-REFERENCE TO RELATED APPLICATIONS

This Utility Patent Application claims priority to German Patent Application No. DE 103 30 812.1, filed on Jul. 8, 2003, which is incorporated herein by reference.

BACKGROUND

The invention relates to a semiconductor memory module having a plurality of memory chips arranged in at least one row and at least one buffer chip which drives and receives clock signals and command and address signals to the memory chips and data signals to and from the memory chips via a clock, address, command and data bus inside the module and which forms an interface to an external primary memory bus.

For very fast memory architectures with large scale integration, such as DDR-III DRAMs, "buffer chips" will be required in future. FIG. 1 illustrates such a memory system, in which the buffer chips 110, 210 situated on respective memory modules 100, 200 are connected in concatenated fashion to a primary memory bus 400 routed to a memory controller 300. On the buffer chips 110, 210, a switching arrangement S ensures that data are read from or written to the respective addressed memory module 100 or 200 only. The roman numerals I, II, III and IV denote individual memory groups with a respective plurality of memory chips situated in a row one behind the other on the memory modules 100 and 200. The buffer chips 110, 210 convert the "stub bus", as used today in DDR and DDR-II systems, into a type of hierarchical bus system in which only point-to-point or point-to-two-point connections now arise. Such connections allow data transfer rates of far beyond one Gbps. In addition, cascading allows a large number of buffer chips to be concatenated with one another and allows memory systems having a very large number of memory chips to be produced on just one primary memory bus 400.

FIG. 2 illustrates a schematic layout view of how a memory module (DIMM) having a buffer chip 110 (HUB) and eight memory chips can be designed internally. Clock signal lines shown in dashes and dots and command and address bus lines (CIA) shown in dashes are driven centrally by the buffer chip 110, are routed in succession to the memory chips 101, 102, . . . 108 (DRAMs) in a "fly-by topology" and are terminated at the end by terminations a1, a2, b1, b2 in order to avoid signal reflections. The data bus lines (DQ), shown by solid lines in FIG. 2, in the DRAMs are connected to the buffer chip 110 separately as point-to-point connections.

At the high frequencies at which future computer systems and hence their memory systems will be operated, the propagation time of the signals on the aforementioned connecting lines is of fundamental importance. In the text below, 200 ps for each link (buffer chip to DRAM and DRAM to DRAM) will respectively be assumed for these propagation times. From the buffer chip 110 to the first DRAM (for example 104), all of the signals (CLK, C/A, DQ, DQS) thus require 200 ps, and 800 ps to the fourth DRAM (for example 101). Since the clock signal CLK and the command and address signal C/A have the same propagation time, commands and addresses can be transferred without difficulty from the buffer chip 110 to the respective DRAM chip. A similar situation applies for transferring write data (DQ, DQS) to the DRAMs. From the point of view of the overall system, the fact that the actual write operation in the DRAMs respectively takes place at different times is only of minor importance.

When data are to be read from the DRAMs, the following problem arises: the propagation times of the CLK signals and of the C/A signals on the bus mean that the DRAM chips receive the read command at different times. The difference between the first and the last DRAM in our example is 600 ps. After a certain time, which will be assumed to be the same for all DRAMs, the DRAM chips start to return their data to the buffer chip 110. The propagation time from the DRAM chip to the buffer chip is now again dependent on the position of the DRAM chip on the memory module (DIMM), with the propagation time in this arrangement being longest for the DRAM chip which received the command last. For this reason, the data will arrive at the buffer chip 110 with a time delay, specifically with a respective delay amounting to twice the propagation time from the buffer chip 110 to the DRAM chip. From the first to the last data, 1200 ps=1.2 ns therefore elapse.

This time delay in the read data either limits the maximum operating frequency to values which are significantly below 800 MHz (=1.125 ns) or needs to be compensated for by a complicated circuit in the buffer chip, which will result in a further delay in the data, since the earliest data can be forwarded with a delay of at least 1.2 ns plus the processing time in the compensation circuit.

DE 102 06 060 A1 describes a memory system in which each memory module has a plurality of memory chips and a buffer chip arranged on it. In read mode, the clock signals and the read signals have the same direction of propagation. This memory system has further basic differences as compared with the present semiconductor memory module: first, the data signals are supplied to the memory chips on the modules directly from a memory controller via spur lines. The propagation times of the command and address signals and of the data signals vary. Similarly, the respective propagation times of the read and write data signals from the respective memory modules to the memory controller are different. Finally, the known memory system has synchronous clock control for all of the memory modules as a result of the clock signal WCLK generated by the memory controller, and synchronous generation of the read clock signal RCLK in each buffer chip in each memory module.

SUMMARY

In one embodiment of the present invention, a semiconductor memory module of the generic type is provided such that the time delay between the clock or command and address signals and the data signals becomes significantly shorter.

In one embodiment, the present invention includes a semiconductor memory module having a plurality of memory chips arranged in at least one row and at least one buffer chip that drives and receives clock signals and command and address signals to the memory chips and data signals to and from the memory chips via a clock, address, command and data bus inside the module and which forms an interface to an external primary memory bus. The semiconductor memory module has two, four, six or eight buffer chips arranged on it and all of the memory chips are connected to two respective buffer chips at least by one signal line type from the group comprising clock signal lines, data signal lines and command and address signal lines and just to one of the two buffer chips by the remaining signal lines from the group, and the sum of the electrical signal propagation times for the actuating signals via their lines from one buffer chip to a respective one of the memory chips and the electrical signal propagation times for the data signals from this memory chip to the other buffer chip during the read operation is the same for all of the memory chips. Control means for controlling the respective data write and read operation to or from the memory chips are provided in order to drive the clock signals and command and address signals in the same respective direction as the data signals via the bus inside the module when data are being written and read.

One embodiment of the invention provides at least two buffer chips, which are also called HUB chips, on the semiconductor memory module at the two respective ends of a row of memory chips. The two buffer chips or HUB chips may have the same or a different functionality. The memory chips on the semiconductor memory module are connected to the at least two buffer chips using at least one connection (the clock signal lines CLK, the command and address signal lines C/A or the data lines DQ, DQS).

The control means ensure that, when data are being written, command and address signals move in the same direction as data signals, that is to say arrive at the memory chips simultaneously from each other's point of view. This means that the time delay between the individual memory chips is irrelevant.

The control means also ensure that, when data are being read, the command and address signals likewise move in the same direction as the data signals, which means that they arrive at one of the buffer chips simultaneously from each other's point of view. In this case, the time delay between the individual memory chips is precisely compensated for again upon command signal reception by the different propagation times of the data signals.

A plurality of variant embodiments are possible with the present invention. When the semiconductor memory module holds two buffer chips which have different functionalities, one solution option is for the writing of data to involve the second buffer chip behaving passively and setting up just one active termination for the clock, command and address bus lines. The time delay remains between the individual memory chips, but has no further disturbing effect in the system. In this variant, reading involves the clock signals and the command and the address signals being driven only by the second buffer chip, while the first buffer chip sets up the terminations. The clock signal lines and the command and address signal lines in the bus inside the module are accordingly bidirectional, since the signals can be transferred in both directions. The read data from the memory chips are sent to the first buffer chip (only this chip is connected to the data signal lines associated with the memory chips). In this case, the data arrive at the first buffer chip simultaneously. However, since the memory chip which is furthest away from this first buffer chip and whose data signals have the longest propagation time to the first buffer chip had the shortest propagation time for the command and address signals from the second buffer chip, that is, that this memory chip accordingly received the read command earlier.

In another variant solution (which is not shown in the drawing), the data bus lines are connected to the first and to the second buffer chip. Reading still involves the first buffer chip driving the clock signals and the command and address signals, but the read data likewise travel from the memory chips to the second buffer chip, that is, from left to right in the drawing, where they likewise arrive simultaneously. The second buffer chip may, but does not have to, be connected to the clock and command and address lines. In this variant, the clock, command and address lines and data signal lines are unidirectional in the sense that the signals only ever travel in one direction, that is, from left to right in the drawing.

Another variant embodiment is a semiconductor memory module having two identical buffer chips. In this case, the memory chips on the semiconductor memory module are divided into two groups, each having the same number of chips. By way of example, the first four memory chips form a first group and the second four memory chips form a second group. These groups are associated with a respective one of the buffer chips by virtue of their data signal lines connecting them to the associated buffer chip and their clock, command and address signal lines connecting them to at least one of the two buffer chips. In a variant embodiment with two identical buffer chips, writing involves command and address signals and write data traveling together from the buffer chip to the memory chip. Reading involves command and address signals for the first group of memory chips being driven by the second buffer chip and the data signals in this group traveling further to the first buffer chip. By contrast, for the second group of memory chips, the command and address signals come from the first buffer chip and the data arrive at the second buffer chip simultaneously. In this case, the clock, command and address signal lines are again bidirectional. From this variant, it would be possible to derive a further version such that the clock, command and address signals and data signals are only driven in one direction, for example from the first buffer chip in the direction of the second buffer chip for the first group of memory chips and from the second buffer chip in the direction of the first buffer chip for the second group of memory chips.

An additional variant is also possible in which a read operation and a write operation are performed simultaneously on the same semiconductor memory module. In this case too, the directions of travel for the command and address signals and for the data signals are the same.

One embodiment of the invention permits a novel type of semiconductor memory module in which the time delay between the individual memory chips in the case of data writing is irrelevant and that the time delay upon command reception in the case of reading is precisely compensated for by the different propagation times of the data.

The description below describes various exemplary embodiments of a semiconductor memory module in line with the invention with reference to the figures of the drawing, the memory chips being assumed to be DRAM chips and the memory module being assumed to be a DIMM module, by way of example, but could be other chips as well in accordance with the invention. At this juncture, it should also be pointed out that, in the description and also in the appended patent claims, the respective designations and reference symbols for the data, clock and command and address signals are also synonymous for these signals' respective signal lines. It should also be mentioned that two buffer chips or HUB chips are used in the description below, by way of example. Instead, a semiconductor memory module in line with the invention may also be equipped with four, six or eight buffer chips if it is desirable or necessary to reduce the number of pins on the respective buffer chips. Such an increase in the number of buffer chips does not depart from the solution principle specified in the claims.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6A schematically illustrates a further exemplary embodiment of a semiconductor memory module in line with the invention having two identical buffer chips and, by way of example, eight memory chips.

FIG. 6B schematically illustrates a further exemplary embodiment of a semiconductor memory module in line with the invention having four buffer chips and, by way of example, eight memory chips, with two respective buffer chips having the same functionality.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
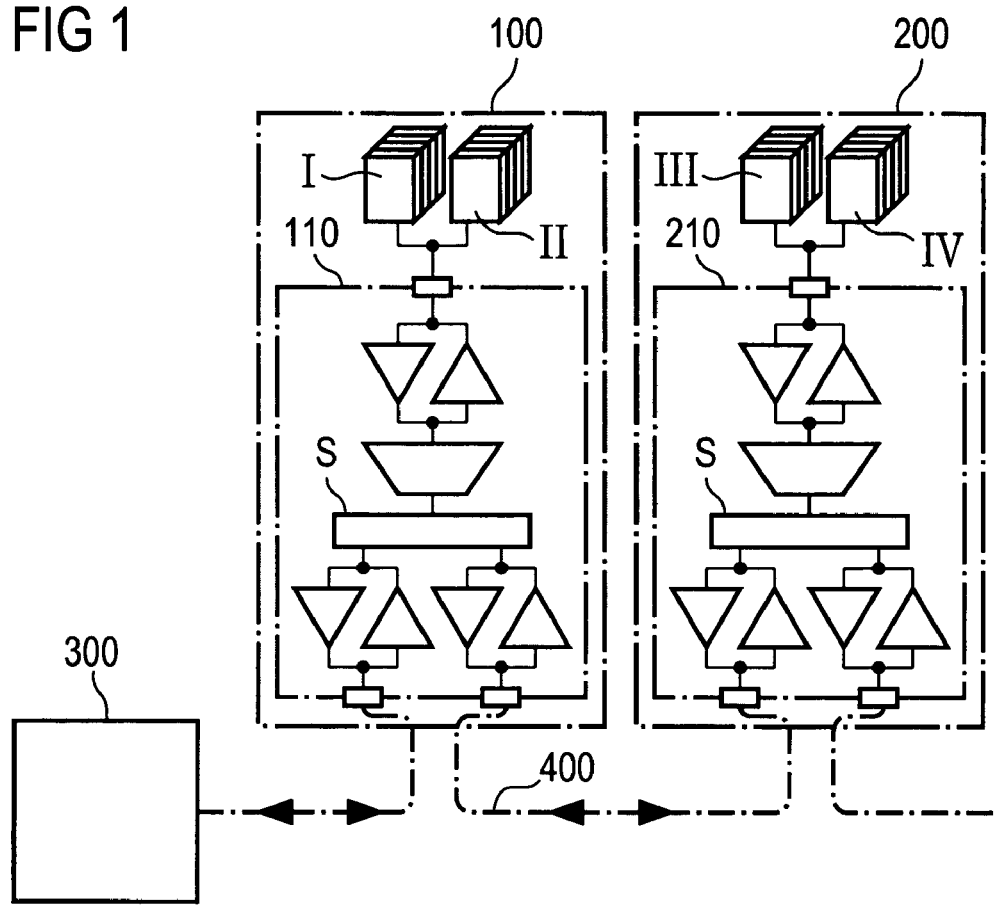
FIG. 1 schematically illustrates a conventional memory system having concatenated buffer chips.
Figure 2:
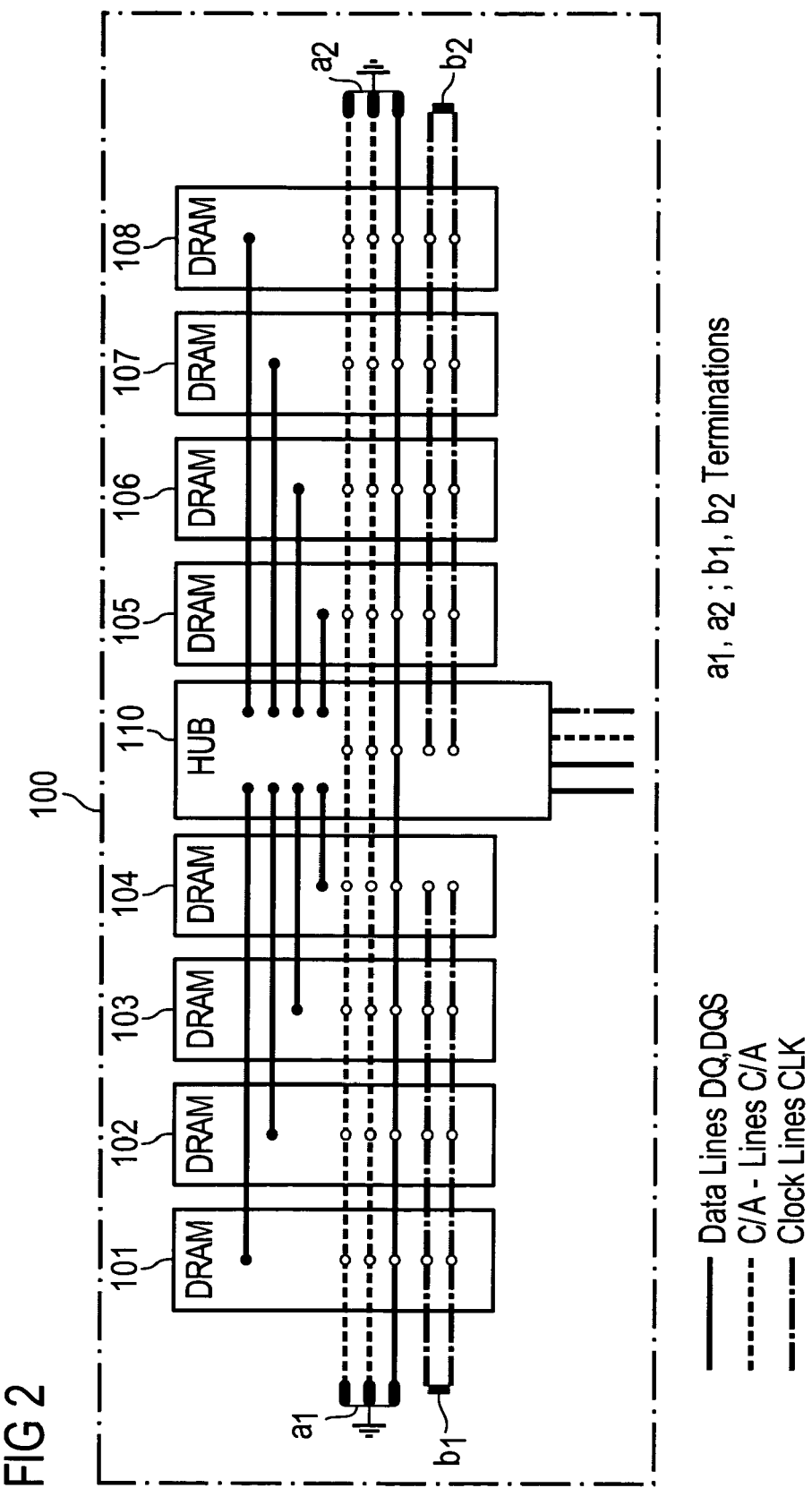
FIG. 2 illustrates a conventional memory system having concatenated buffer and an inline clock topology used in this arrangement.
Figure 3:
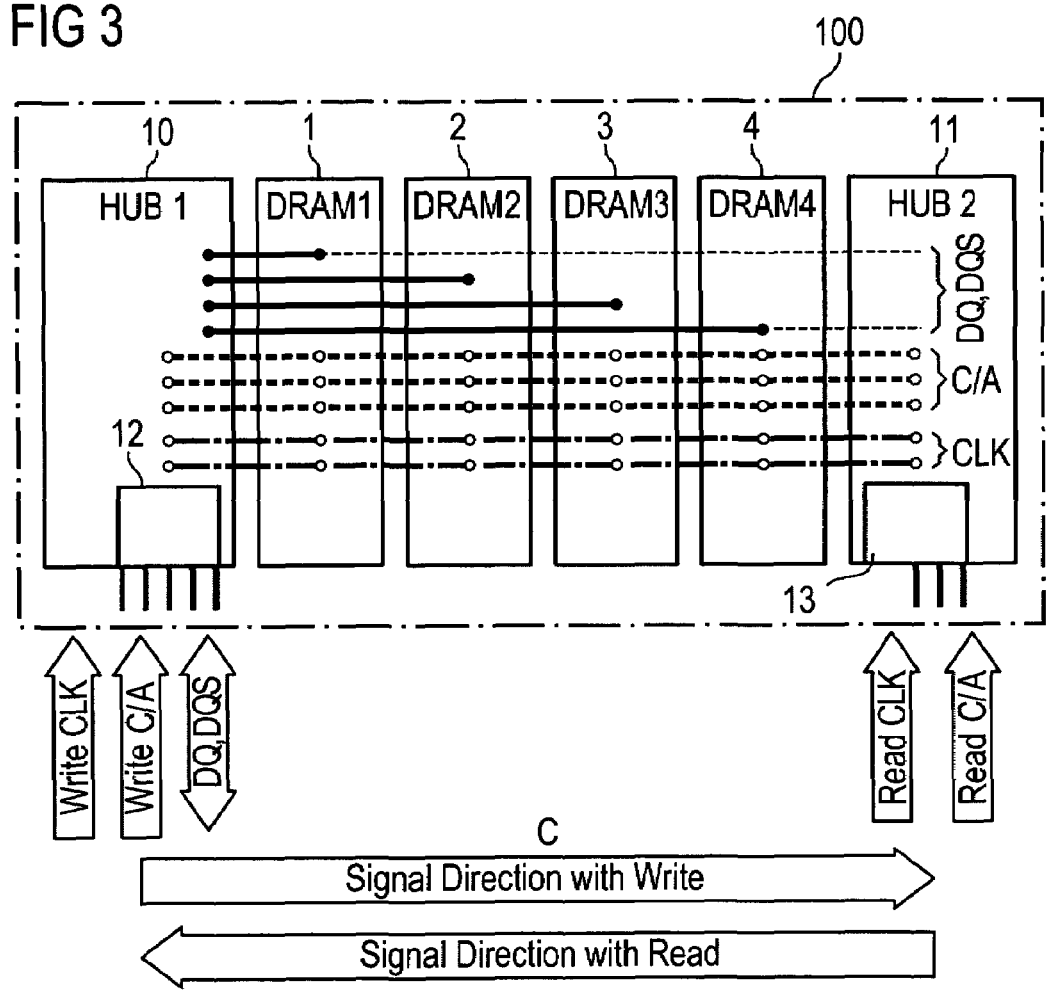
FIG. 3 illustrates a schematic layout view of an exemplary embodiment of a semiconductor memory module having two different buffer chips and, by way of example, four memory chips, the remaining memory chips having been omitted for the sake of simplification.

FIG. 3 schematically illustrates a semiconductor memory module in line with the invention which is denoted generally by the reference numeral 100, has a plurality of memory chips 1-4 and has two differential buffer chips 10 and 11 (also denoted by HUB1 and HUB2) which drive and receive clock signals CLK and command and address signals C/A to the memory chips 1-4 and data signals DQ, DQS to and from the memory chips 1-4 via a clock, address, command and data bus inside the module. In this first exemplary embodiment illustrated in FIG. 3, the two buffer chips 10 and 11 have different functionalities. Both buffer chips 10 and 11 contain the respective control device 12 and 13.

Solid signal lines show a bidirectional data bus running between the memory chips 1-4 and the first buffer chip 10, shown on the left, said data bus being denoted by DQ, DQS. Dashed lines denote a bidirectional command/address bus by C/A, said command/address bus connecting all of the memory chips 1-4 to the two buffer chips 10 and 11. Dash-dot lines are used to show bidirectional differential clock bus lines CLK. The arrows shown in the bottom portion of FIG. 3 symbolize the respective signal direction for writing and for reading, as explained in more detail below with reference to FIGS. 4 and 5.

The left-hand buffer chip 10 or HUB1 receives a write clock CLK, write command and address data C/A via an external primary memory bus, receives write data and outputs read data DQ, DQS. The second buffer chip 11 or HUB2 receives a read clock CLK and read command and address signals C/A. The control devices 12 and 13 respectively contained in the buffer chips 10 and 11 ensure that, in the case of data writing, the command and address signals C/A move in the same direction as the data signals DQ, DQS. That is, from each other's point of view, the write command and address signals and the write data arrive at the memory chips, in the example DRAM chips 1-4, simultaneously, which means that the time delay between the DRAM chips 1-4 is irrelevant. In the case of data reading, the control devices 12 and 13 ensure that the command and address signals C/A likewise move in the same direction as the read data signals DQ, DQS, that is, from each other's point of view, they arrive at one of the buffer chips 12, 11 simultaneously. In this case, the time delay between the individual DRAM chips upon command and address reception is precisely compensated for again by the different propagation times of the data signals. At this juncture, it must be mentioned that the control devices 12, 13 do not need to be parts of the buffer chips 10, 11, but instead may be contained in a memory controller (not shown) which is outside of the module.

Figure 4:
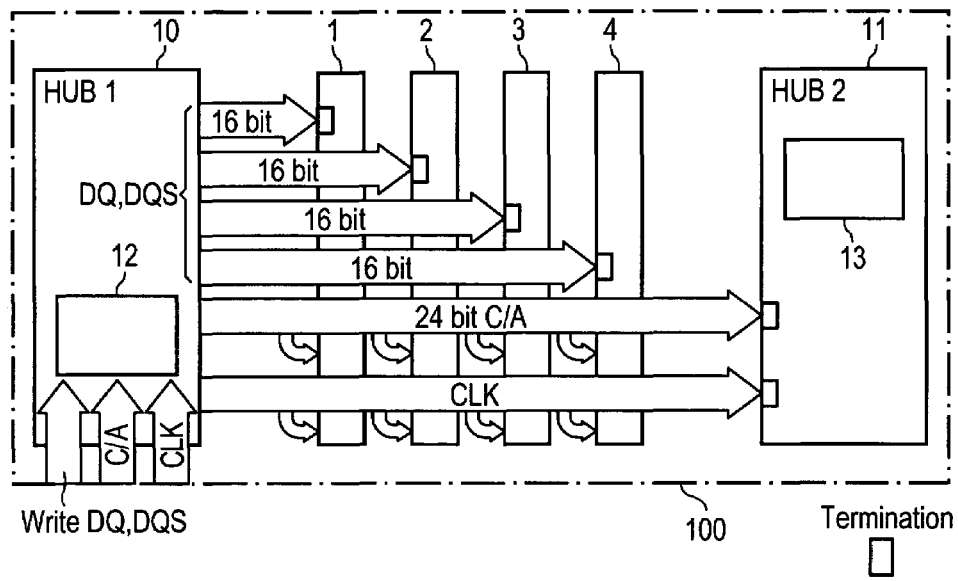
FIG. 4 illustrates the flow of data for a semiconductor memory module as shown in FIG. 3 during the write operation.

FIG. 4 schematically illustrates the flow of data for writing for the exemplary embodiment, shown in FIG. 3, of a semiconductor memory module in line with the invention. In this case, the second buffer chip 11 (HUB2), shown on the right, behaves passively and merely sets up an (active) termination for the clock lines CLK and command and address bus lines. The time delay remains between the individual DRAM chips 1-4, but has no further disturbing effect on the system.

Figure 5:
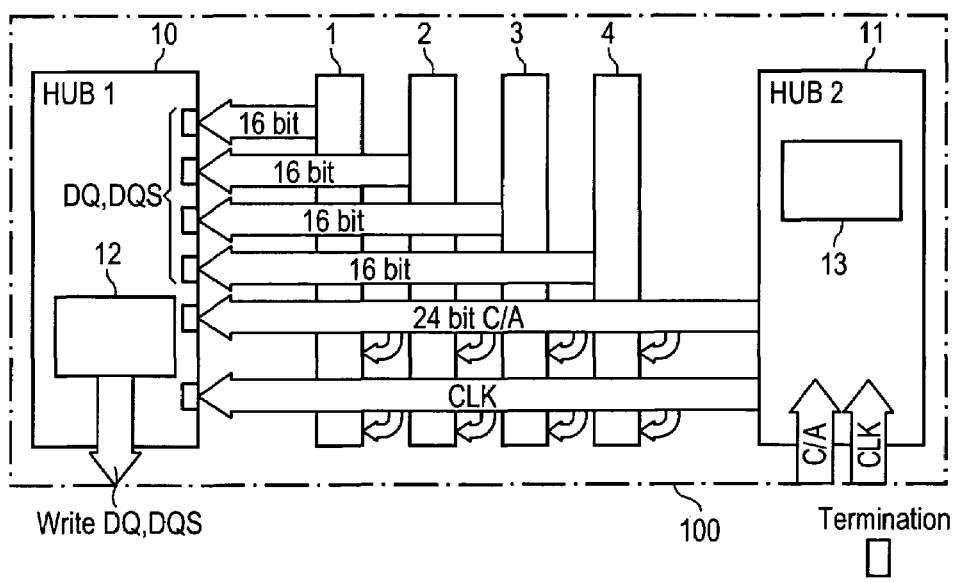
FIG. 5 illustrates the flow of data for a semiconductor memory module as shown in FIG. 3 during the read operation.

In the reading case shown in FIG. 5, the clock signals CLK and the command and address signals C/A are driven by the second buffer chip 11 (HUB2). The first buffer chip 10 (HUB1) sets up the (active) termination. Clock (CLK) and command and address bus lines (C/A) are bidirectional, since the signals can be transferred in both directions. The read data from the DRAM chips 1-4 are sent to the first buffer chip 10 (HUB1). Only the first buffer chip 10 is connected to the data signal lines DQ, DQS associated with the DRAM chips. In this case, the data arrive at the first buffer chip 10 simultaneously, since the DRAM chip 4 which is furthest away from the first buffer chip 10 and has the longest propagation time for the data to the first buffer chip had the shortest propagation time for the command and address data from the second buffer chip 2, that is, received the read command correspondingly earlier.

It will also be noted here that FIGS. 3 to 5 illustrate only four DRAM chips, merely for the sake of simplicity. An ordinary DIMM semiconductor memory module may also hold eight, and frequently sixteen, DRAM chips whose directional control for the read/write data and the clock and command and address signals for the case of two buffer chips 10, 11, each with different functionalities, is effected exactly in the same way as has been outlined above with reference to FIGS. 3 to 5.

FIG. 6A illustrates an exemplary embodiment of a semiconductor memory module in line with the invention having two identical buffer chips 10. By way of example, this semiconductor memory module has eight memory chips 1-8. The eight memory chips 1-8 are divided into two groups of equal size, G1 with the memory chips 1-4 and G2 with the memory chips 5-8. In terms of their data signal lines DQ, DQS1, the first group G1 with the memory chips 1-4 is associated with the buffer chip 10 shown on the left, and the second group G2 with the memory chips 5-8 is associated with the second buffer chip 10, shown on the right. By contrast, the clock signal lines CLK1 and CLK2 shown in dashes and dots and also the command and address signal lines C/A1 and C/A2, shown in dashes, in the two groups G1 and G2, that is, in all of the memory chips 1-8, are connected to both buffer chips 10, 10. Both buffer chips 10, 10 contain a respective control device 12, which may alternatively be situated outside of the module, as already mentioned.

In the inventive exemplary embodiment shown in FIG. 6B, the semiconductor memory module contains, likewise by way of example, eight memory chips 1 to 8 which, as in the exemplary embodiment in FIG. 6A, are divided into two groups $G_1$ and $G_2$ of equal size. In the exemplary embodiment in FIG. 6B, however, the semiconductor memory module contains four buffer chips HUB1, HUB2, HUB3, HUB4, with the memory chips 1-4 in the first group $G_1$ being connected only to HUB1 and HUB2, which each have a different functionality, and the memory chips 5-8 in the second group $G_2$ being connected only to HUB3 and HUB4, which each have a different functionality. The functionality of HUB1 is the same as that of HUB3. The functionality of HUB2 is the same as that of HUB4. All of the buffer chips HUB1-HUB4 contain a respective control device 12, which may alternatively be provided outside of the module.

Figure 7:
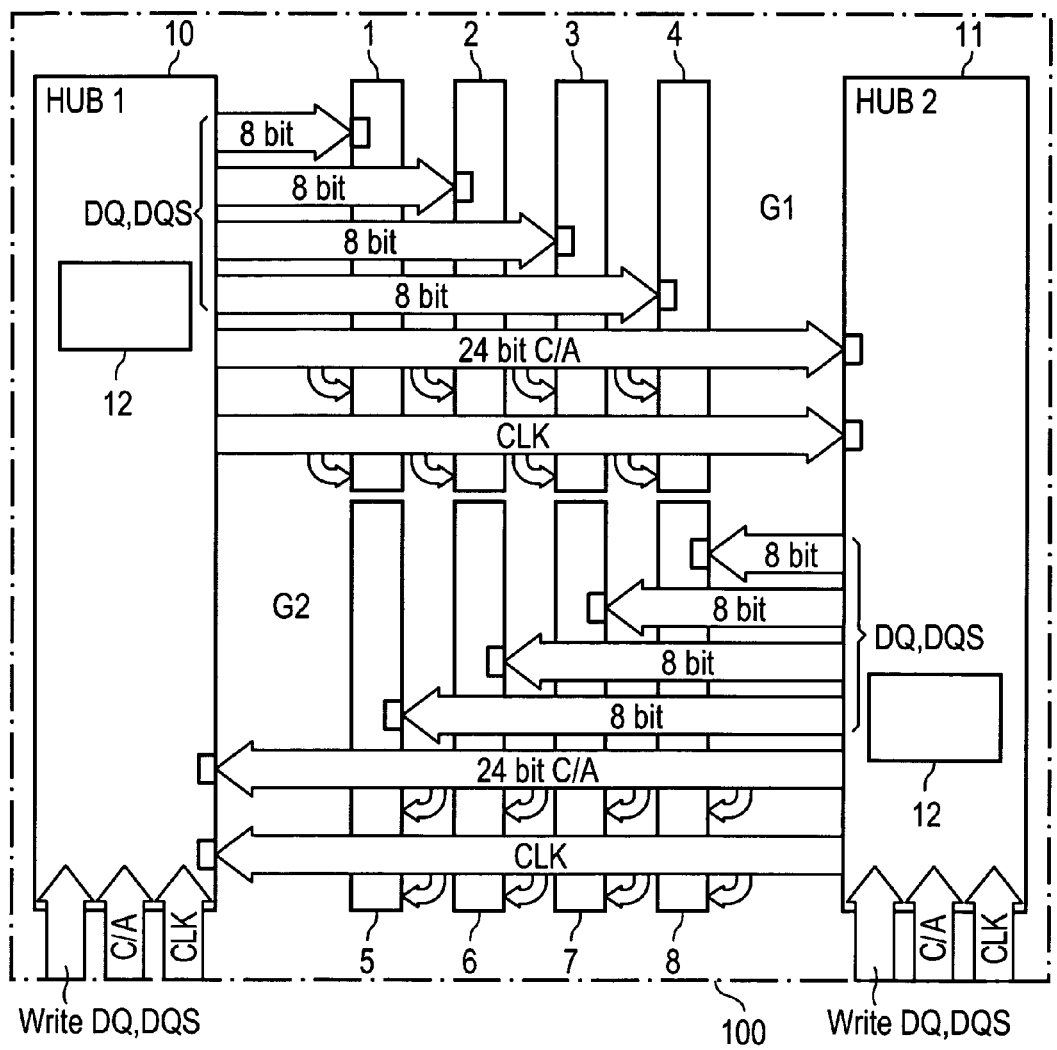
FIG. 7 illustrates the flow of data for a semiconductor memory module designed as in FIG. 6A during the write operation.

FIG. 7 illustrates the flow of data for the exemplary embodiment of a semiconductor memory module in line with the invention which is shown in FIG. 6A for the case of writing. It can be seen from FIG. 7 that writing involves the clock and command and address signals C/A and the data signals DQ, DQS, respectively traveling from the outside together from the buffer chip 10 to the DRAM chip, specifically starting from the left-hand buffer chip 10 for the first (top) group G1 with the memory chips 1-4, that is, from left to right. For the command and address signal lines C/A and the differential clock lines CLK in the first group G1, the buffer chip 10 (HUB2) shown on the right sets up an active termination. For the second (bottom) group G2 of memory chips 5-8, the data DQ, DQS travel from the second memory chip 10 (HUB2) to the left, and the command and address signals C/A and the clock signals CLK travel in the same direction. The latter and the command and address signals are actively terminated by the first buffer chip 10 (HUB1).

Figure 8:
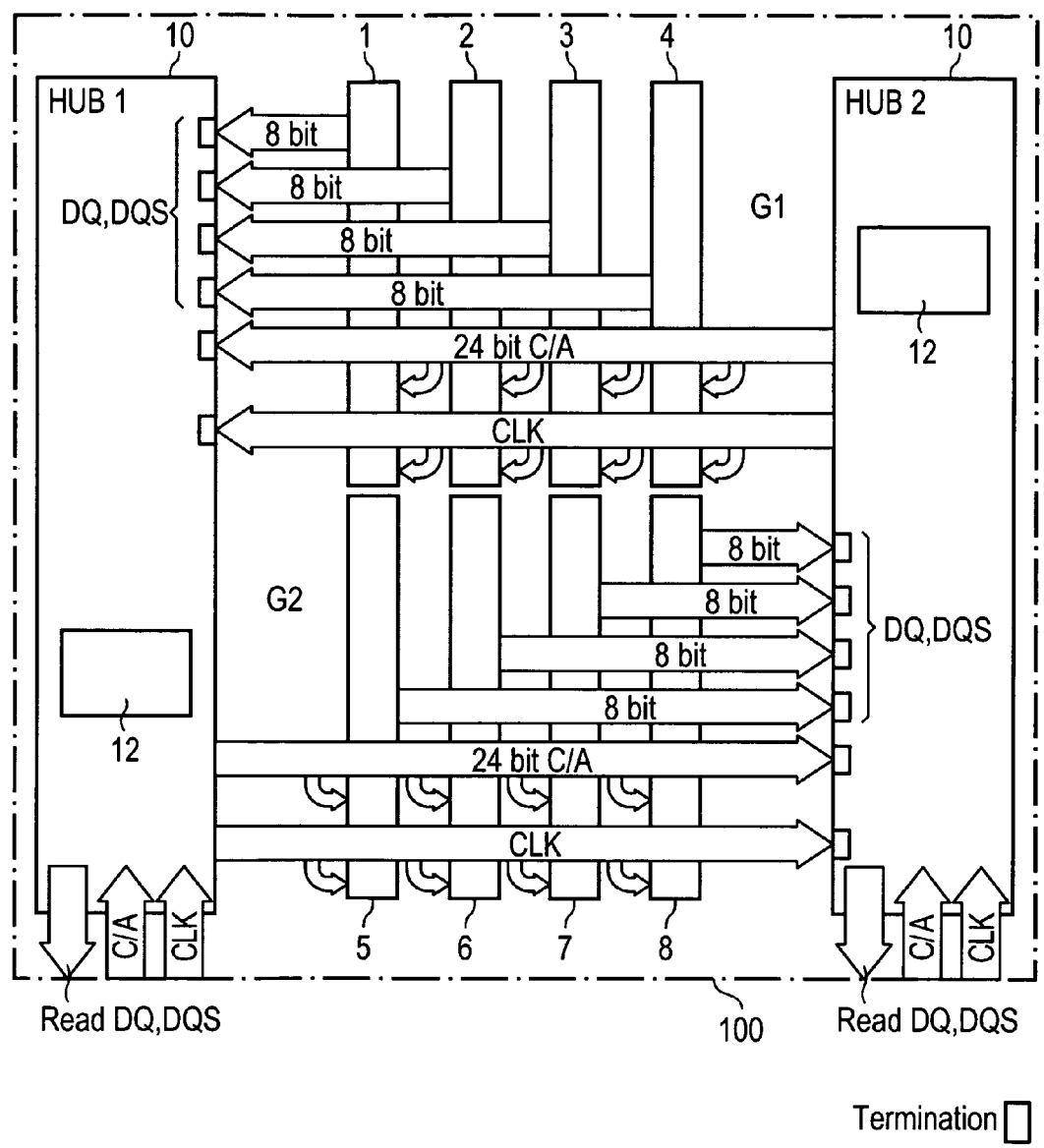
FIG. 8 illustrates the flow of data for a semiconductor memory module designed as in FIG. 6A during the read operation.

For the case of reading in the semiconductor memory module in line with the invention which is shown in FIG. 6A and has two identical buffer chips 10, FIG. 8 illustrates that the command and address signals C/A and the clock signals CLK for the first group G1 with the DRAM chips 1-4 are driven by the second buffer chip 10 (HUB2) and that the read data from the memory chips 1-4 in the group G1 also travel from right to left. In that case, the first buffer chip 10 (HUB1), shown on the left, forms an active termination for the clock signals CLK, the command and address signals C/A and the read data signals DQ, DQS, respectively. For the second group G2, shown at the bottom, with the DRAM chips 5-8, the direction of travel for the clock signals CLK, for the command and address signals C/A and for the read data DQ, DQS is the reverse, that is, from left to right, with the second buffer chip 10 (HUB2), shown on the right, forming a respective active termination for these signals. The command and address signals C/A arrive at the second buffer chip 10 (HUB2) at the same time as the read data signals DQ, DQS. In this case, the clock signal lines CLK and the command and address lines C/A are again bidirectional.

Figure 9:
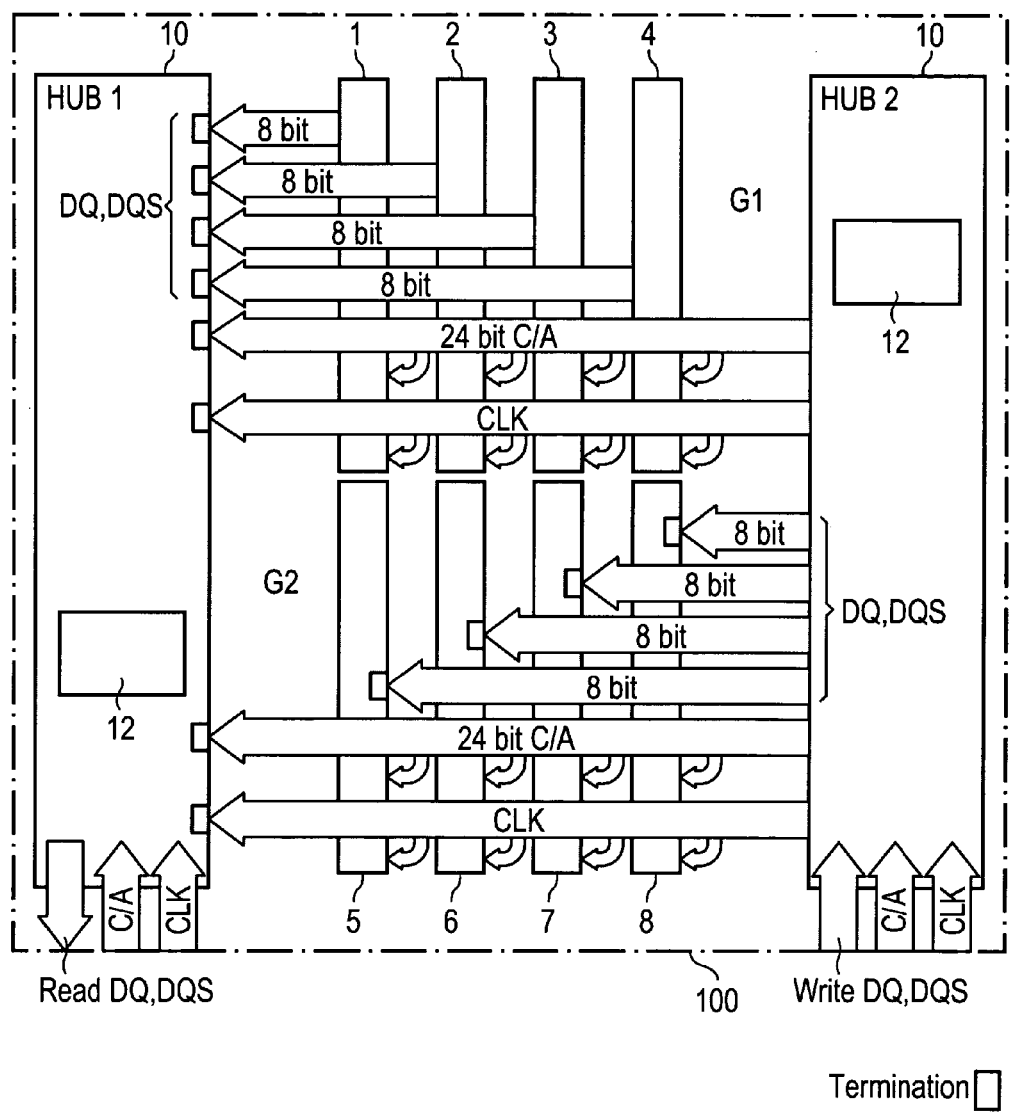
FIG. 9 illustrates a flow of data for a semiconductor memory module designed as in FIG. 6A during simultaneous writing and reading.

FIG. 9 illustrates a variant of a semiconductor memory module in line with the invention which is shown in FIG. 6A and has two identical buffer chips 10, 10, said variant involving a read operation and a write operation being performed simultaneously on the same semiconductor memory module 100. Data are read from the DRAM memory chips 1-4 in the first group G1, while data are simultaneously written to the DRAM chips 5-8 in the second group G2. In this context too, the directions of travel for the command and address signals and the data signals are the same, in the case shown in FIG. 9 from right to left, that is to say from the second buffer chip 10 (HUB2) to the first buffer chip 10 (HUB1), for all of the signals (clock signals CLK, command and address signals C/A and data signals DQ, DQS) for both groups.

From the above description of the functions in line with FIGS. 7 to 9, it becomes apparent that this description also applies to the variant with four buffer chips which is shown in FIG. 6B, since this merely involves the functions of each of the two buffer chips in FIG. 6A being split over two respective buffer chips (FIG. 6B).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory module arranged on one module board, the memory module comprising:
    a plurality of memory chips arranged in one or more memory chip rows and an even number of buffer chips for receiving and driving to the memory chips clock signals, command and address signals and for receiving and driving data signals from and to the memory chips via a module-internal bus including signal line types of clock, address, command and data signal lines, said buffer chips forming an interface between the module-internal bus and a module-external primary memory bus;

wherein all memory chips are arranged on the module board in at least one memory chip group;

wherein each memory chip group comprises the same number of memory chips in at least one of said memory chip rows;

wherein a first and second of said buffer chips are respectively arranged on the end sides of each memory chip row;

wherein the memory chips of the at least one memory chip row are connected to both said first and second buffer chips at least by one of said signal line types and to exactly one of said buffer chips by the remaining signal line types;

control means for controlling data write and read operation to and from the memory chips in order to drive the clock signals and command and address signals in the respectively same direction as the flow direction of write data signals and read data signals via the module-internal bus; and wherein the arrangement of the buffer chips and the memory chips within each memory chip row and the control of the control means effect that the sum of electrical signal propagation times for the clock, command and address signals via their lines from one of said first and second buffer chips to a respective one of the memory chips of said at least one memory chip row plus the electrical signal propagation times for the data signals from the same one memory chip to the other of said first and second buffer chips during a read operation is the same for all memory chips of said at least one memory chip row.

2. The semiconductor memory module of claim 1, wherein said first and second buffer chips arranged at the end sides of said at least one memory chip row each having a different functionality.

3. The semiconductor memory module of claim 2, wherein the memory chips of said at least one memory chip row are connected by the clock signal lines and their command and address signal lines bidirectionally to both said first and second buffer chips and by their data signal lines just to said first buffer chip, and the control means allow said first buffer chip to drive the clock and command and address signals and the write data signals when data are being written, with the second buffer chip setting up an active termination for the clock and command and address signal lines and allow the second buffer chip to drive the clock and command and address signals when data are being read, with the first buffer chip receiving the read data and also setting up an active termination for the data signal lines and the clock and command and address signal lines.

4. The semiconductor memory module of claim 2, wherein the memory chips of said at least one memory chip row are connected by their data signal lines to both said first and second buffer chips and by their clock and also command and address signal lines unidirectionally at least to the first buffer chip and the control means allows said first buffer chip during writing to drive the write data signals and the clock and also command and address signals and during reading to drive the cock, command and address signals, with the second buffer chip receiving the read data signals and setting up an active termination for said read data signals.

5. The semiconductor memory module of claim 4, wherein the second buffer chip is additionally connected at least to the clock or command and address signal lines and sets up an active termination for these signal lines.

6. The semiconductor memory module of claim 1, wherein said first and second buffer chips have an identical functionality, and the memory chips on the module board are arranged in at least two groups, each group having the same number of chips, with each memory chip group being connected by its signal lines to a respective one of the first and second buffer chips and by its clock, command and address signal lines to at least one of the first and second buffer chips.

7. The semiconductor memory module of claim 6, wherein the control means allow the clock, command and address signals for a respective memory chip group to be driven by the respective associated of the first and second buffer chips, which also drives the write data signals when data are being written and allow the clock, command and address signals to be driven by the other of the first and second buffer chips which does not receive the read data signals, when data are being read from the respective memory chip group.

8. The semiconductor memory module of claim 1, wherein the memory chips are chips which are operated or can be operated at a multiple data rate, particularly DDR-DRAM chips, and the data signals contain a data strobe signal.

9. The semiconductor memory module of claim 8, wherein the semiconductor memory module is a DIMM module that includes two buffer chips and at least eight DRAM memory chips.

10. The semiconductor memory module of claim 8, wherein the semiconductor memory module is a DIMM module that includes two buffer chips and at least sixteen DRAM memory chips.

11. The semiconductor memory module of claim 1, wherein the number of buffer chips is 2.

12. The semiconductor memory module of claim 1, wherein the number of buffer chips is 4.

13. The semiconductor memory module of claim 1, wherein the number of buffer chips is 6.

14. The semiconductor memory module of claim 1, wherein the number of buffer chips is 8.

15. A semiconductor memory module arranged on one module board, the memory module comprising:

a module-internal signal bus of clock, address, command and data signal lines, said module-internal signal bus being interfaced to an external primary memory bus;

a plurality of memory chips arranged in at least one memory chip row;

an even number of buffer chips forming said interface to the external primary memory bus, two of the buffer chips are arranged respectively as a first and a second buffer chip at the left and right end sides of each memory chip row, connected to the memory chips of said row by at least one signal line type among the signal lines of the module internal signal bus, said at least one signal line type comprising clock signals lines, data signal lines, and command and address signal lines;

said two buffer chips being configured to receive and drive to the memory chips clock signals and command and address signals and to receive and drive data signals from and to the memory chips during read and write operations; and control means for controlling respective data write and read operations to or from the memory chips to drive the clock signals and command and address signals in the same respective direction as the write and read data signals on the module internal signal bus, wherein the clock and command and address signals have electrical signal propagation times from the first buffer chip to a first memory chip within said memory chip row and the data signal has eletrical signal propagation time from the same memory chip within the same memory chip row to the first buffer chip and wherein the sum of the electrical signal propagation time for the clock, command and address signal plus the electrical signal propagation time for the data signal during the read operation is the same for all memory chips within the same memory chip row.

16. The semiconductor memory module of claim 15, wherein the two buffer chips to which the memory chips of one memory chip row are connected have different functionality.

17. The semiconductor memory module of claim 15, wherein the two buffer chips to which the memory chips of one memory chip row are connected have an identical functionality and the memory chips are divided into at least two groups, each group having the same number of memory chips and memory chip rows, with each memory chip group being connected by its data signal lines to a respective one of the buffer chips and by its clock, command and address signal lines to at least one of the two buffer chips.

18. The semiconductor memory module of claim 17, wherein the control means allow the clock, command and address signals for a respective memory group to be driven by the respective associated buffer chip, which also drives the write data signals, when data are being written, and allow the clock, command and address signals to be driven by the other buffer chip, which does not received the read data signals, when data are being read from the respective memory group.

19. The semiconductor memory module of claim 18, wherein the control means allow the clock, command and address signals for a respective memory group to be driven by the respective associated buffer chip, which also drives the write data signals, when data are being written, and allow the clock, command and address signals to be driven by the other buffer chip, which does not receive the read data signals, when data are being read from the respective memory group.

* * * * *